United States Patent [19]

Fudala et al.

[11] Patent Number: 5,055,971
[45] Date of Patent: Oct. 8, 1991

[54] MAGNETIC COMPONENT USING CORE CLIP ARRANGEMENT OPERATIVE FOR FACILITATING PICK AND PLACE SURFACE MOUNT

[75] Inventors: John J. Fudala, Pequannock, N.J.; Magda H. Samaha, Dallas, Tex.

[73] Assignee: AT&T Bell Laboratories, Murray Hill, N.J.

[21] Appl. No.: 454,563

[22] Filed: Dec. 21, 1989

[51] Int. Cl.⁵ .............................................. H05K 7/02
[52] U.S. Cl. ...................... 361/400; 174/35 R; 336/65; 336/67; 336/210; 361/424; 361/427
[58] Field of Search ............... 361/386, 388, 424, 403, 361/404, 406, 414, 427; 174/16.3, 138 D, DIG. 8; 200/295; 248/505, 231.8, 400; 336/210, 65, 67, 212

[56] References Cited

U.S. PATENT DOCUMENTS

| | | | |
|---|---|---|---|
| 2,494,350 | 1/1950 | Mittermaier | 336/65 |
| 2,770,435 | 11/1956 | Becker | 248/505 |
| 3,169,235 | 2/1965 | Ouletta | 336/210 |
| 3,298,646 | 1/1967 | Van Buren, Jr. | 248/903 |
| 3,310,268 | 3/1967 | Kramer | 248/903 |
| 4,206,435 | 6/1980 | Harris et al. | 336/65 |
| 4,283,699 | 8/1981 | Ehrgott et al. | 336/67 |
| 4,325,044 | 4/1982 | Ehrgott et al. | 336/67 |
| 4,394,636 | 7/1983 | Hiraku et al. | 336/212 |
| 4,791,395 | 12/1988 | Henderson, Sr. | 174/DIG. 8 |
| 4,990,880 | 2/1991 | Albert | 336/65 |

Primary Examiner—Leo P. Picard
Assistant Examiner—Donald A. Sparks
Attorney, Agent, or Firm—A. G. Steinmetz

[57] ABSTRACT

A core securing clip to hold the two core members of the core of a surface mount magnetic component together is designed with a large planar surface to provide a suitable surface to facilitate the use of pick and place apparatus in mounting the magnetic component on a printed circuit board. The subject clip is fastened over the top of the magnetic component and has spring loaded members that apply forces to opposing sides of the two core members joined together in order to join them together as a single core.

4 Claims, 3 Drawing Sheets

MAGNETIC COMPONENT USING CORE CLIP ARRANGEMENT OPERATIVE FOR FACILITATING PICK AND PLACE SURFACE MOUNT

FIELD OF THE INVENTION

This invention relates to construction for magnetic components and in particular to a clip arrangement for securing core members of a magnetic core together and facilitating pick and place operations in mounting the magnetic component on a circuit substrate.

BACKGROUND OF THE INVENTION

Surface mounting of electrical components on circuit substrates using pick and place equipment is very cost effective in the manufacture of circuits. Applying this technique to magnetic components has been difficult because of the irregularities of the outer surface of this component which lower the efficiency of the vacuum pick up devices of the pick and place equipment since no suitable pick up surface is provided. These irregularities are due in part to the construction of the magnetic component since it is an assembly of windings, bobbins, core members and two spring clip devices to secure the two core members together.

This amalgam of parts also limits the structural integrity of the magnetic component making the component prone to fall apart if the circuit board is roughly or frequently handled. While this may in some instances be cured by potting the magnetic component such a solution is not always desirable.

SUMMARY OF THE INVENTION

A core securing clip to hold the two core members of the core of a surface mount magnetic component together is designed with a large planar surface to provide a suitable surface to facilitate the use of pick and place apparatus in mounting the magnetic component on a printed circuit board. The subject clip is fastened over the top of the magnetic component and has spring loaded members that apply forces to opposing sides of the two core members joined together in order to join them together as a single core.

DETAILED DESCRIPTION

Figure 1:
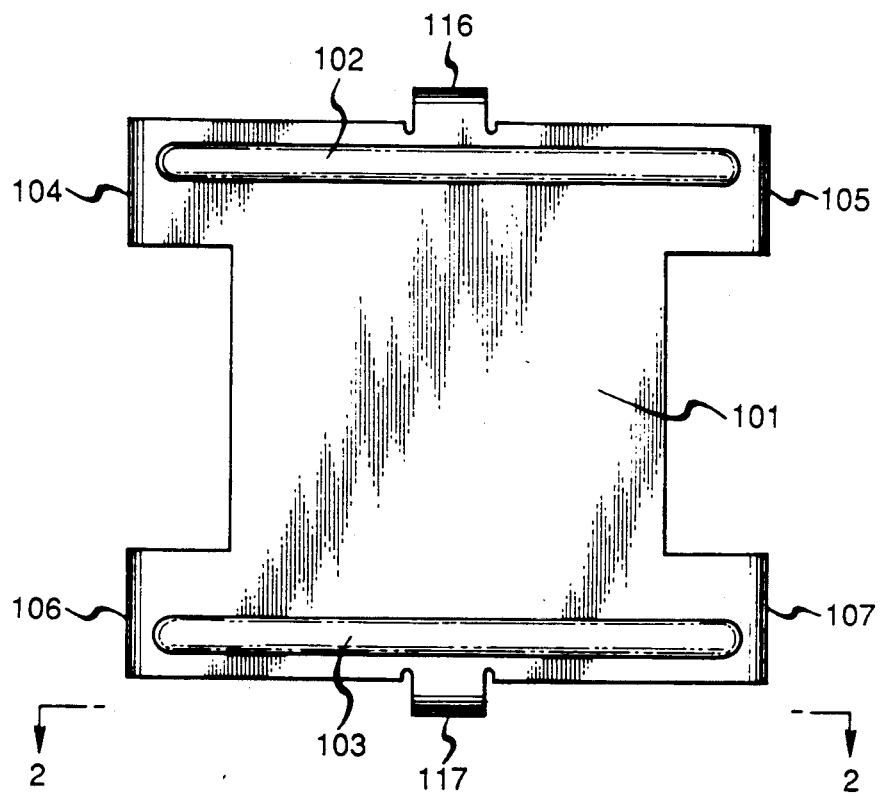
FIG. 1 is a top view of a spring clip arrangement according to the invention.
Figure 2:
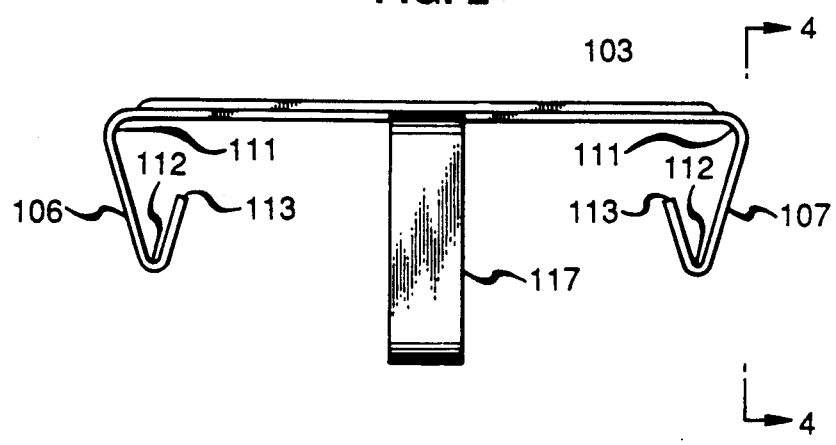
FIG. 2 is a front view of a spring clip arrangement according to the invention.
Figure 3:
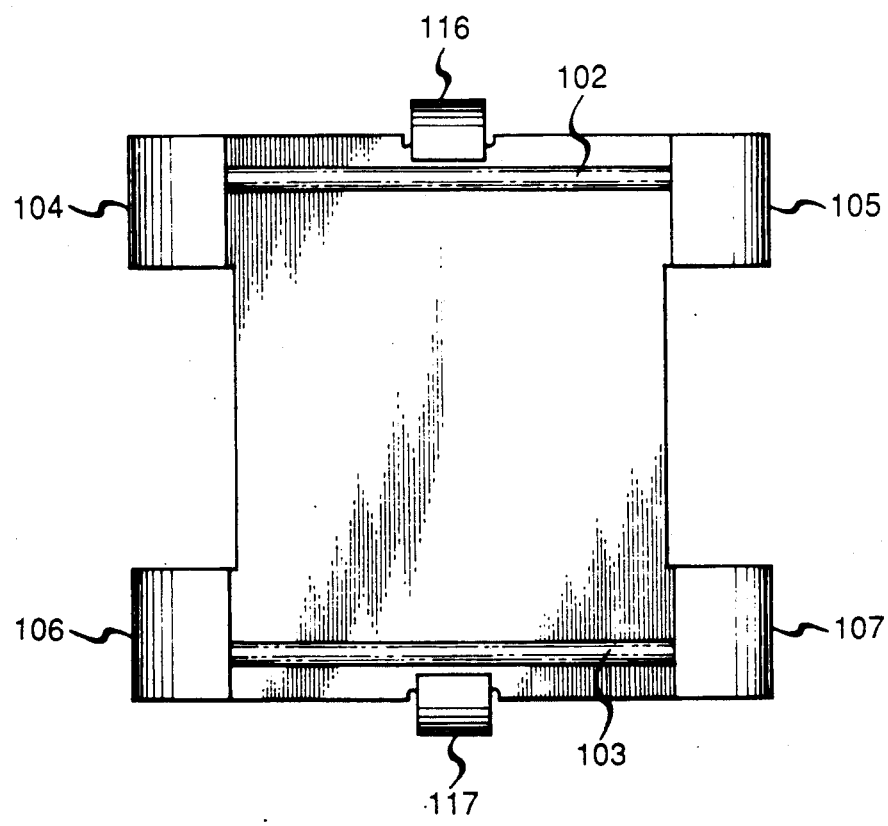
FIG. 3 is a bottom view 2 of spring clip arrangement according to the invention.
Figure 4:
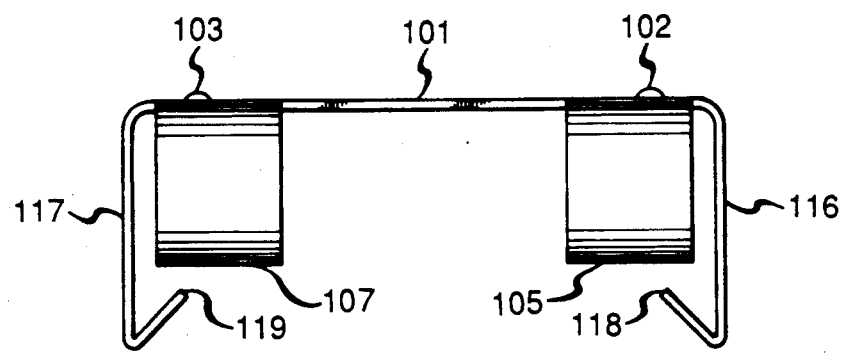
FIG. 4 is a side view 2 of a spring clip arrangement according to the invention.

Orthoginal views of a spring clip for securing the core members of a magnetic component together and facilitating the use of pick and place equipment in circuit assembly are shown in FIGS. 1-4. To facilitate the description identical reference numerals will be used in the first four figures.

The spring clip includes a flat planar surface member 101 which provides a surface to accommodate the use of pick and place equipment. The clip is preferably formed out of a resilient metal such as a spring steel or material with similar properties. Stiffness enhancement ribs 102 and 103 are adjacent opposite sides of the flat planar surface member 101. These ribs 102 and 103 are formed into the planar surface member in alignment with the grain of the spring steel by indentations of the metal surface as part of a stamping process in forming the spring clip.

First and second pressure bearing members 104 and 105 are at opposite ends of the rib 102. Third and fourth pressure bearing members 106 and 107 are at opposite ends of the rib 103. These pressure bearing members are designed to grip the opposite sides of two adjacent core members (typically E-E members) that are to be joined into a single core structure. These pressure bearing members are formed with a V cross-section. The free end of this V cross-section engages the side of the core member. Compressive action is centered about the bending capabilities at the radii 111 and 112 and the point end 113 engages the side of the core member.

First and second securing members 116 and 117 are included at opposite ends of the planar surface and each securing member 116 and 117 being adjacent to one of the ribs 102 and 103, respectively. The end points 118 and 119 are sized so that they engage an under side of the adjacent E core members to secure the spring clip to the core.

Figure 5:
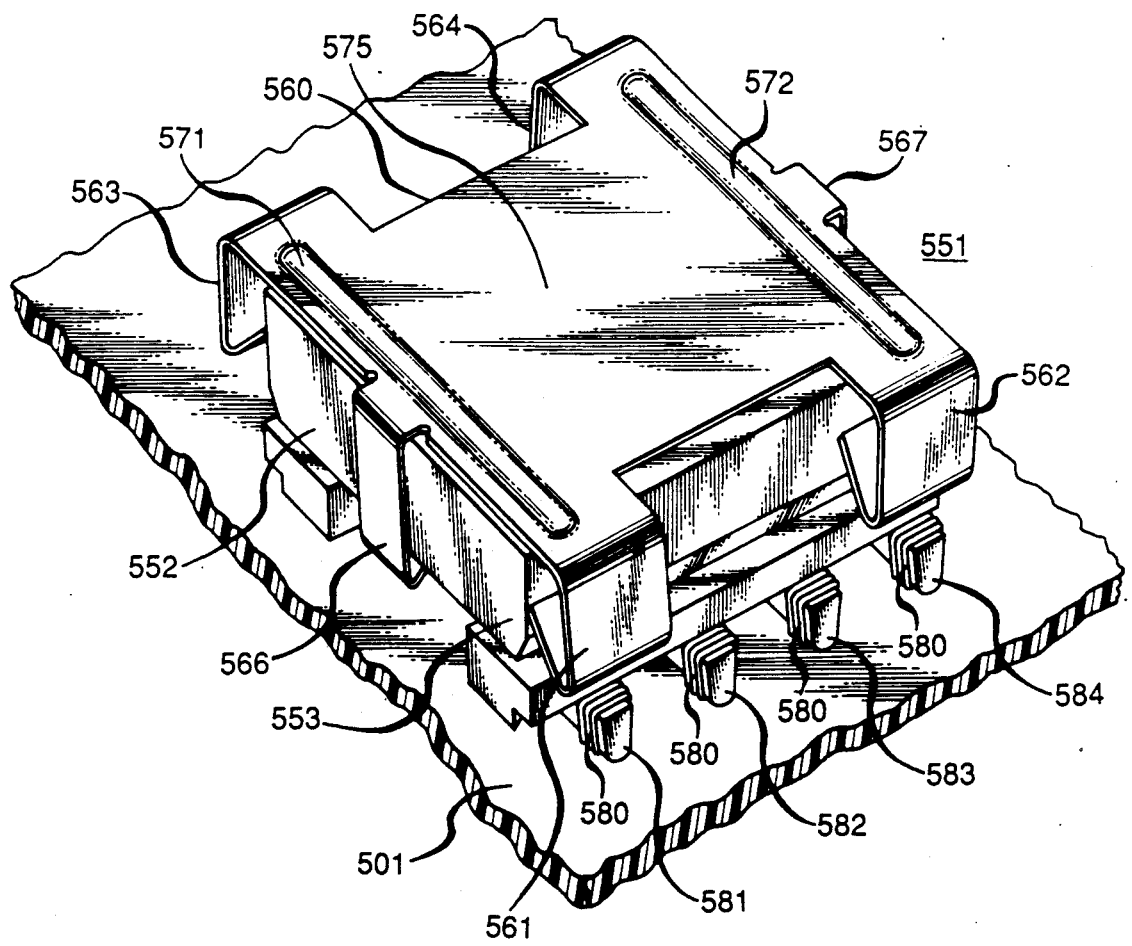
FIG. 5 is a perspective view of a magnetic component mounted on a circuit substrate and having its two piece core secured by the spring clip of FIGS. 1-4.

A perspective view of a surface mount magnetic component having a spring clip arrangement according to the invention is shown positioned on a circuit board or substrate 501 in FIG. 5. The magnetic component 551 has its E shaped core members 552 and 553 secured together with a spring clip 560. The four pressure bearing members 561-564 secure the two core members 552 and 553 together to form the complete operative core of the magnetic component.

Two securing members 566 and 567 on opposite sides of the spring clip positively secure the clip to the core by engaging an underside of the core itself. The two impressed ribs 571 and 572 give rigidity to the top surface of the spring clip. The planar surface 575 is used by vacuum pick and place equipment to place the magnetic component so that the wire terminations 580, which are securely wound on the bobbin pinouts 581-584 are positioned on the connecting lands of the circuit substrate 501. Surface mounting is completed with a reflow solder technique.

We claim:

1. In combination:

a circuit substrate;

a magnetic component mounted on the circuit substrate;

the magnetic component comprising, a magnetic core having a first and second core member;

a spring clip formed out of a resilient metal and mounted for securing the first and second core members together;

the spring clip comprising:

a flat planar surface substantially covering a top area of the magnetic component;

first and second pairs of pressure bearing members, positioned on opposing sides of the flat planar surface, each pressure bearing member having a substantially oblique V-shaped bend at its core engaging end with each pressure bearing member engaging a side of one of the first and second core members with spring produced pressure of the resilient metal in which a free end of each oblique V-shaped bend engages a side of the core member and is operative for securing the first and second core members together; and first and second securing members positioned on opposite sides between the opposing sides of the planar surface; said securing members having a sufficiently longitudinal member dimension extending downwardly therefrom with a substantially oblique V-shaped bend at the end so that a free end of each oblique V-shaped bend engages an underside of the mangetic core component.

2. A circuit arrangement, comprising:

a magnetic component, including;

a core having first and second core members, clip apparatus formed from resilient metal for securing the first and second core members into one core, the clip apparatus having a planar surface substantially covering a top of the magnetic component for facilitating handling of the magnetic component by pick and place apparatus;

the clip apparatus including first and second pairs of pressure bearing members, positioned on opposing sides of the flat planar surface, each pressure bearing member having a V-shaped bend at its engaging end with the free end of the V-shaped each individually engaging a side of one of the first and second core members with spring induced pressure of the resilient metal and operative for securing the first and second core members together;

the clip apparatus including first and second securing members having a linear dimension of sufficient length positioned on opposing sides of the planar surface and extending downwardly therefrom, and including a V-shaped bend at the free end of each member so that the free end engages an underside of the magnetic core.

3. A combination as claimed in claim 1;

wherein the flat planar surface includes first and second stiffness enhancement ribs formed into the planar surface and aligned with a grain of the resilient metal.

4. A circuit arrangement as claimed in claim 2;

wherein the planar surface includes stiffness enhancement ribs into the planar surface.

* * * * *